(12) United States Patent
Zhan et al.

(10) Patent No.: US 11,804,458 B2
(45) Date of Patent: Oct. 31, 2023

(54) METHOD OF FABRICATING INTEGRATED CIRCUIT DEVICE

(71) Applicant: WUHAN XINXIN SEMICONDUCTOR MANUFACTURING CO., LTD., Wuhan (CN)

(72) Inventors: Qiong Zhan, Wuhan (CN); Sheng Hu, Wuhan (CN); Jun Zhou, Wuhan (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 106 days.

(21) Appl. No.: 17/564,799

(22) Filed: Dec. 29, 2021

(65) Prior Publication Data
US 2023/0020810 A1   Jan. 19, 2023

(30) Foreign Application Priority Data

Jul. 13, 2021   (CN) .......................... 202110791598.0

(51) Int. Cl.
*H01L 23/00* (2006.01)
*H01L 21/768* (2006.01)

(52) U.S. Cl.
CPC ........ *H01L 24/03* (2013.01); *H01L 21/76897* (2013.01); *H01L 24/06* (2013.01);
(Continued)

(58) Field of Classification Search
CPC ... H01L 24/03; H01L 21/76897; H01L 24/06; H01L 24/08; H01L 24/80; H01L 2224/03009; H01L 2224/0345; H01L 2224/0362; H01L 2224/03845; H01L 2224/06517; H01L 2224/0845; H01L 2224/80895; H01L 2224/80896; H01L 29/1004; H01L 29/737; H01L 21/84; H01L 27/095; H01L 29/0847; H01L 29/66787; H01L 29/78; H01L 29/7839;
(Continued)

(56) References Cited

U.S. PATENT DOCUMENTS 9,666,566 B1 * 5/2017 Chen ................. H01L 25/105
10,157,867 B1 * 12/2018 Chen ................. H01L 23/5385
(Continued)

*Primary Examiner* — Niki H Nguyen
(74) *Attorney, Agent, or Firm* — MUNCY, GEISSLER, OLDS & LOWE, P.C.

(57) ABSTRACT

A method of fabricating an IC device is disclosed, in which a dielectric layer is first etched to form a contact opening and a dummy opening. Both do not extend through the dielectric layer, the contact opening has a width greater than that of the dummy opening. A sacrificial layer, which covers inner surface of the dummy opening and the dielectric layer at side surface of the contact opening, and from which the dielectric layer at bottom surface of the contact opening is exposed, is then formed, and under protection of this sacrificial layer, the dielectric layer exposed in the contact opening is etched in a self-aligned manner, a self-aligned contact hole is formed, in which a surface of the conductive structure is exposed. In this way, reliability of a contact that extends in both contact opening and self-aligned contact hole is ensured, avoiding the problem of possible contact failure.

18 Claims, 3 Drawing Sheets

(52) U.S. Cl.
CPC .............. *H01L 24/08* (2013.01); *H01L 24/80* (2013.01); *H01L 2224/03009* (2013.01); *H01L 2224/0345* (2013.01); *H01L 2224/0362* (2013.01); *H01L 2224/03845* (2013.01); *H01L 2224/06517* (2013.01); *H01L 2224/08145* (2013.01); *H01L 2224/80895* (2013.01); *H01L 2224/80896* (2013.01)

(58) Field of Classification Search
CPC ............. H01L 21/0337; H01L 21/0338; H01L 21/28026; H01L 21/31144; H01L 21/761; H01L 21/76819; H01L 21/76895; H01L 21/823431; H01L 21/823493; H01L 23/5283; H01L 23/552; H01L 23/556; H01L 27/0617; H01L 27/0817; H01L 27/0886; H01L 27/0924; H01L 27/10
See application file for complete search history.

(56) References Cited

U.S. PATENT DOCUMENTS

| | | | |
|---|---|---|---|
| 10,629,616 B1* | 4/2020 | Kai | H10B 43/10 |
| 10,930,619 B2* | 2/2021 | Ye | H01L 23/481 |
| 11,393,781 B2* | 7/2022 | Watanabe | H01L 24/06 |
| 2014/0145338 A1* | 5/2014 | Fujii | H01L 23/49866 |
| | | | 257/762 |
| 2017/0250160 A1* | 8/2017 | Wu | H01L 25/0657 |
| 2018/0374864 A1* | 12/2018 | Fukuzumi | H01L 21/185 |
| 2019/0096830 A1* | 3/2019 | Wei | H01L 24/92 |
| 2019/0131255 A1* | 5/2019 | Teng | H01L 24/94 |
| 2020/0098707 A1* | 3/2020 | Chen | H01L 24/03 |
| 2020/0203329 A1* | 6/2020 | Kanamori | H10B 43/27 |

* cited by examiner

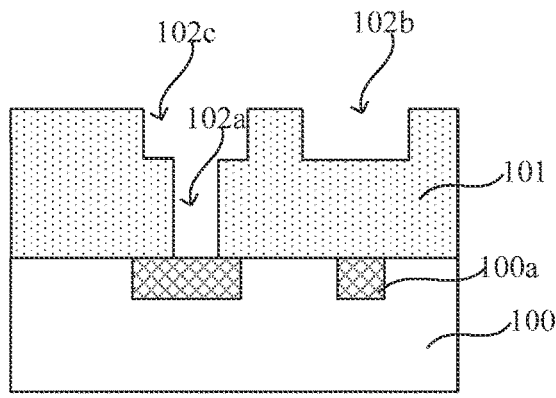

Fig. 1

Prior Art

| PROVIDE FIRST WAFER CONTAINING FIRST CONDUCTIVE STRUCTURE AND FORM FIRST DIELECTRIC LAYER ON SURFACE OF FIRST WAFER — S1 |

| ETCH FIRST DIELECTRIC LAYER TO FORM THEREIN FIRST CONTACT OPENING AND FIRST DUMMY OPENINGS, BOTH NOT EXTENDING THROUGH FIRST DIELECTRIC LAYER, FIRST CONTACT OPENING HAVING WIDTH GREATER THAN WIDTH OF FIRST DUMMY OPENINGS — S2 |

| FORM FIRST SACRIFICIAL LAYER, WHICH COVERS AT LEAST INNER SURFACES OF FIRST DUMMY OPENINGS AND SIDE SURFACE OF FIRST CONTACT OPENING, WITH FIRST DIELECTRIC LAYER BEING EXPOSED AT BOTTOM SURFACE OF FIRST CONTACT OPENING — S3 |

| UNDER PROTECTION OF FIRST SACRIFICIAL LAYER, ETCH FIRST DIELECTRIC LAYER EXPOSED IN FIRST CONTACT OPENING IN SELF-ALIGNED MANNER UNTIL FIRST CONDUCTIVE STRUCTURE UNDER FIRST CONTACT OPENING IS EXPOSED, THUS FORMING FIRST SELF-ALIGNED CONTACT HOLE UNDER FIRST CONTACT OPENING — S4 |

| REMOVE AT LEAST FIRST SACRIFICIAL LAYER IN FIRST CONTACT OPENING, FIRST SELF-ALIGNED CONTACT HOLE AND FIRST DUMMY OPENINGS AND FILL FIRST CONTACT OPENING, FIRST SELF-ALIGNED CONTACT HOLE AND FIRST DUMMY OPENINGS WITH METAL, THEREBY FORMING FIRST CONTACT AND FIRST DUMMY CONTACTS — S5 |

Fig. 2

METHOD OF FABRICATING INTEGRATED CIRCUIT DEVICE

CROSS-REFERENCES TO RELATED APPLICATION

This application claims the priority of Chinese patent application number 202110791598.0, filed on Jul. 13, 2021, the entire contents of which are incorporated herein by reference.

TECHNICAL FIELD

The present invention relates to the field of integrated circuit (IC) fabrication, more particularly to a method of fabricating an IC device.

BACKGROUND

In the current practice of integrated circuit (IC) device fabrication, in order to electrically connect a conductive structure formed within a wafer to the outside via, for example, a solder pad, a bond pad or the like, it is necessary to successively form, in the wafer, a contact hole exposing the conductive structure and a contact opening on top of and in communication with the contact hole. In addition, in order to mitigate surface dishing that may occur due to a load effect of a subsequent chemical mechanical polishing (CMP) process, it may be further necessary to form dummy openings around the contact opening. However, this technique tends to lead to alignment errors between the contact hole and the contact opening, which are detrimental to the reliability of the resulting contact, or may even cause failure thereof. Moreover, it requires the use of too many photomasks, leading to high fabrication cost.

SUMMARY OF THE INVENTION

It is an objective of the present invention to provide a method of fabricating an IC device, which allows self-alignment of a contact opening used for the formation of a contact in a wafer with an underlying contact hole and ensures improved reliability of the resulting contact.

The above objective is attained by a method of fabricating an IC device provided in the present invention, which includes:

providing a first wafer containing a first conductive structure and forming a first dielectric layer on a surface of the first wafer;

etching the first dielectric layer to form therein a first contact opening and first dummy opening, both not extending through the first dielectric layer, the first contact opening having a width greater than a width of the first dummy opening;

forming a first sacrificial layer, which covers at least inner surfaces of the first dummy opening and a side surface of the first contact opening, with the first dielectric layer being exposed at a bottom surface of the first contact opening;

under the protection of the first sacrificial layer, etching the first dielectric layer exposed in the first contact opening in a self-aligned manner until the first conductive structure under the first contact opening is exposed, thus forming a first self-aligned contact hole under the first contact opening; and removing at least the first sacrificial layer in the first contact opening, the first self-aligned contact hole and the first dummy opening and filling the first contact opening, the first self-aligned contact hole and the first dummy opening with a metal, thereby forming a first contact and first dummy contact.

Optionally, the step of etching the first dielectric layer to form therein the first contact opening and the first dummy opening may include:

applying a first photoresist layer onto a surface of the first dielectric layer and performing a photolithography process on the first photoresist layer using a first photomask having a pattern with features for the first contact and the first dummy contact, thereby forming, in the first photoresist layer, a first opening corresponding to the pattern feature for the first contact and second opening corresponding to the pattern features for the first dummy contact, the first opening having a width that is greater than a width of the second opening; and with the first photoresist layer that has undergone the photolithography process serving as a mask, etching the first dielectric layer to form therein the first contact opening and the first dummy opening.

Optionally, the step of forming the first sacrificial layer may include:

forming the first sacrificial layer that covers surfaces of the first dielectric layer, the first contact opening and the first dummy opening and fills up the first dummy opening, the first dummy opening having a depth that is not less than a thickness of the first sacrificial layer covering the bottom surface of the first contact opening; and etching away an undesired portion of the first sacrificial layer so that the remainder of the first sacrificial layer fills up the first dummy opening and forms a sacrificial spacer over the side surface of the first contact opening, from which the first dielectric layer is exposed at the bottom surface of the first contact opening.

Optionally, in the step of etching the first dielectric layer exposed in the first contact opening in a self-aligned manner and thereby forming the first self-aligned contact hole, the sacrificial spacer over the side surface of the first contact opening and the first sacrificial layer filled in the first dummy opening may be partially etched away so that a top surface of the sacrificial spacer is lowered and the first dummy opening are partially exposed.

Optionally, in the step of etching the first dielectric layer exposed in the first contact opening in a self-aligned manner and thereby forming the first self-aligned contact hole, the first self-aligned contact hole may have a width less than the width of the first contact opening.

Optionally, the step of filling the first contact opening, the first self-aligned contact hole and the first dummy opening with the metal and thereby forming the first contact and the first dummy contact may include: depositing the metal until it covers a surface of the first dielectric layer and fills up the first contact opening, the first self-aligned contact hole and the first dummy opening; and performing a chemical mechanical polishing process on the metal and the first dielectric layer until the first dielectric layer is thinned to a specified thickness.

Optionally, the first sacrificial layer may include a carbon-based material including at least one of an organic dielectric material, photoresist, a bottom anti-reflective coating material, a spin-on carbon and amorphous carbon.

Optionally, the remainder of the first sacrificial layer may be ashed away after the first self-aligned contact hole is formed.

Optionally, the method may further include:

providing a second wafer containing a second conductive structure and provided with a second dielectric layer on a surface thereof and forming a second contact and second dummy contact in the second dielectric layer, the second contact extending through the second dielectric layer and coming into electrical connection with the second conductive structure, the second dummy contact not extending through the second dielectric layer; and performing a hybrid bonding process in which the first and second dielectric layers are oriented to face each other and the first and second contacts are aligned with and bonded to each other.

Optionally, the step of forming the second contact and the second dummy contact in the second dielectric layer may include:

etching the second dielectric layer to form therein a second contact opening and second dummy opening, both not extending through the second dielectric layer, the second contact opening having a width that is greater than a width of the second dummy opening;

forming a second sacrificial layer, which covers at least inner surfaces of the second dummy opening and a side surface of the second contact opening, with the second dielectric layer being exposed at a bottom surface of the second contact opening;

under the protection of the second sacrificial layer, etching the second dielectric layer exposed in the second contact opening in a self-aligned manner until the second conductive structure under the second contact opening is exposed, thus forming a second self-aligned contact hole; and removing at least the second sacrificial layer in the second contact opening, the second self-aligned contact hole and the second dummy opening and filling the second contact opening, the second self-aligned contact hole and the second dummy opening with a metal, thereby forming a second contact and second dummy contact.

Optionally, the first conductive structure may include at least one of a gate, a source/drain, a contact plug, a solder pad, a rewiring metal layer and a copper interconnect, and the second conductive structure may include at least one of a gate, a source/drain, a contact plug, a solder pad, a rewiring metal layer and a copper interconnect.

Optionally, as a result of the hybrid bonding process, the first dummy contact may be aligned with and bonded to the second dummy contact.

Optionally, the first dummy contact may be not aligned with and bonded to the second dummy contact.

Optionally, the method may further include, subsequent to the hybrid bonding of the first and second wafers, external electrical connection of the second conductive structure and/or the first conductive structure.

Optionally, the formation of the second contact and the second dummy contact may require the use of a second photomask.

Optionally, a plurality of first dummy contacts scattered around the first contact may be formed to ensure sufficient flatness of a bonding surface of the first dielectric layer, a plurality of second dummy contacts scattered around the second contact may be formed to ensure sufficient flatness of a bonding surface of the second dielectric layer.

Optionally, the first dielectric layer may include, sequentially stacked over the first wafer, an interlayer dielectric layer and a hard mask layer, the interlayer dielectric layer formed as a single film or a stack of multiple films, the hard mask layer formed as a single film or a stack of multiple films.

Optionally, the interlayer dielectric layer may be formed of a material including at least one of silicon oxide, silicon nitride, a low-k dielectric, nitrogen-doped silicon carbide, a bottom anti-reflective coating material, and the hard mask layer may be formed of a nitrogen-containing material.

Compared to the prior art, the present invention has at least one of the following advantages:

1. The dielectric layer on the wafer is etched to simultaneously form the contact opening and dummy openings. The contact opening and dummy openings do not extend through the dielectric layer, and the width of the contact opening is greater than that of the dummy openings. The sacrificial layer from which the dielectric layer on the bottom surface of the contact opening is exposed is then formed, and under the protection of this sacrificial layer, the dielectric layer exposed in the contact opening is etched in a self-aligned manner, resulting in the formation of the self-aligned contact hole, which is self-aligned with the contact opening, and in which the surface of the conductive structure in the wafer is exposed. In this way, reliability of the contact that extends in both the contact opening and the self-aligned contact hole is ensured without alignment errors therebetween, which may cause failure of the contact.

2. The dummy contacts can mitigate surface dishing that may be caused by a load effect of the used CMP process, ensuring the reliability of the subsequent processes.

3. The photoresist layer applied to the surface of the dielectric layer may be photolithographically patterned with only one photomask having a pattern with features for the contact and the dummy contacts so as to form in the photoresist layer two types of openings corresponding to the contact and the dummy contacts and having different widths. Moreover, with the photolithographically patterned photoresist layer serving as a mask, the dielectric layer is etched to simultaneously form the contact opening and dummy openings both not extending through the dielectric layer. Subsequently, under the protection of the sacrificial layer from which the dielectric layer on the bottom surface of the contact opening is exposed, the dielectric layer exposed in the contact opening is etched in a self-aligned manner, resulting in the formation of the self-aligned contact hole in which the surface of the conductive structure in the wafer is exposed. Therefore, compared with the current practice in which the contact hole, the contact opening (in communication with the contact hole) and the dummy openings are formed in two successive photolithographic patterning steps, the use of one photomask (for forming the contact hole) can be saved for at least one of the wafers to be bonded, resulting in a cost reduction and processing simplification.

BRIEF DESCRIPTION OF THE DRAWINGS

FIG. 1 shows a schematic cross-sectional view of an integrated circuit (IC) device being fabricated in the prior art.

FIG. 2 is a flowchart of a method for fabricating an IC device according to a particular embodiment of the present invention.

DETAILED DESCRIPTION

Figure 3:
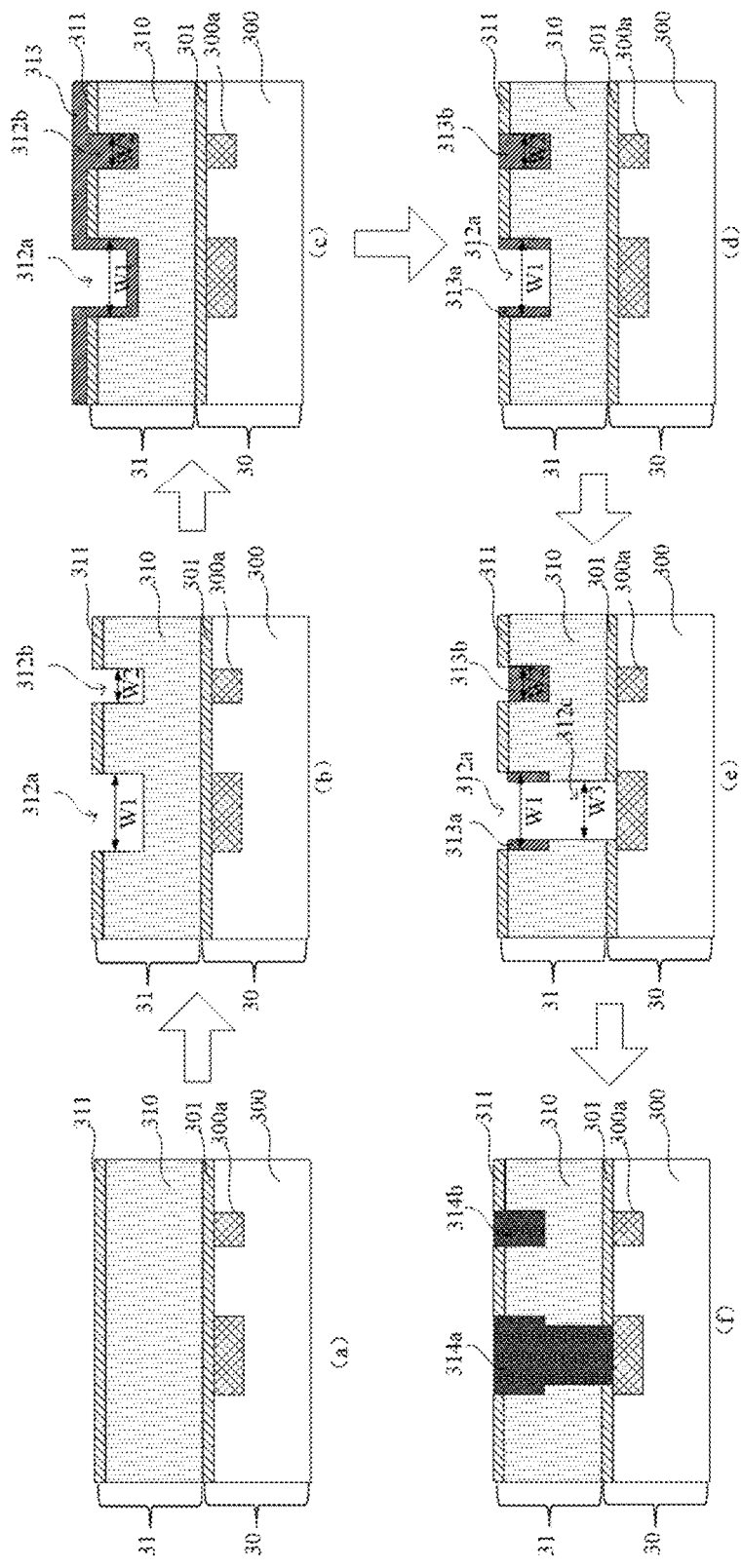
FIG. 3 shows schematic cross-sectional views of structures resulting from steps in the method according to a particular embodiment of the present invention.

In the following detailed description, numerous specific details are set forth in order to provide a more thorough understanding of the present invention. However, it will be apparent to one skilled in the art that the present invention may be practiced even without one or more of these specific details. In other instances, the description of some technical features well-known in the art is omitted in order to avoid obscuring the present invention. It will be understood that the present invention can be carried out in various forms and should not be construed as being limited to the embodiments disclosed herein. Rather, these embodiments are provided so that this disclosure will be thorough and complete, and will fully convey the scope of the invention to those skilled in the art. In the drawings, the dimensions of objects and regions may be exaggerated for clarity. Like numbers refer to like elements throughout. It will be understood that when an element or a layer is referred to as being "on" or "connected to" another element or layer, it can be directly on or directly connected to the other element or layer, or intervening elements or layers may also be present. In contrast, when an element is referred to as being "directly on" or "directly connected to" another element, there are no intervening elements or layers present. Although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. Spatially relative terms, such as "under," "below," "lower," "over," "upper" and the like, may be used herein for ease of description to describe an element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may otherwise be oriented (rotated 90 degrees or at other orientations) and the spatially relative descriptors used herein interpreted accordingly. The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein the term "and/or" includes any and all combinations of one or more of the associated listed items.

The prior art and the present invention will be described in greater detail below by way of specific embodiments with reference to the accompanying drawings. Advantages and features of the present invention will become more apparent from the following description. Note that the figures are provided in a very simplified form not necessarily drawn to exact scale for the only purpose of helping to explain the embodiments disclosed herein in a more convenient and clearer way.

As explained in the Background section, in the current practice of integrated circuit (IC) device fabrication, with reference to FIG. 1, in order to electrically connect a conductive structure 100a formed within a wafer 100 to the outside via, for example, a solder pad, a bond pad or the like, it is necessary to successively form, in a dielectric layer 101 deposited over the surface of the wafer 100, a contact hole 102a exposing the conductive structure 100a and a contact opening 102c on top of and in communication with the contact hole 102a. However, this technique tends to lead to alignment errors between the contact hole 102a and the contact opening 102c, which are detrimental to the reliability of the resulting contact, or may even cause failure thereof.

With the continuous development of semiconductor technology, 3DIC (three-dimensional integrated circuit), a technique using wafer-level packaging to stack and bond different wafers together, have found wide use thanks to its advantage of high performance, low cost and high integration.

In existing 3DIC processes, in order to bond and electrically connect two wafers together, in addition to contact holes for establishing the electrical connection formed in both wafers at their interfaces, as well as to contact openings in communication with the respective contact holes, it is also necessary to arrange several dummy openings (dummy patterns) to mitigate surface dishing that may result from a load effect of a subsequent chemical mechanical polishing (CMP) process and thus achieve an extremely high degree of flatness without bubbles at bonding surfaces of the two wafers as desired by the subsequent bonding. Referring to FIG. 1, the formation of the contact holes 102a, contact openings 102c and the dummy openings 102b in the bonding surfaces of the wafers 100 may involve a series of photolithography and etching steps using a photomask (mask) for forming the contact holes 102a that extend through a dielectric layer 101 and expose conductive structures 100a in the wafer 100 and another series of photolithography and etching steps using another photomask for forming, in the dielectric layer 101, the dummy openings 102b and the contact openings 102c in communication with the contact holes 102a.

Apparently, in these existing 3DIC processes, the formation of contacts in each wafer prior to the bonding requires the use of two separate photomasks for successively forming the upper contact openings and the lower contact holes, necessitating the alignment of the contact openings with the respective contact holes. Any error arising from the alignment may have an adverse impact on the shape and reliability of the resulting contacts, or even cause their failure in worse cases. Moreover, as each wafer requires the use of two photomasks, the bonding and electrical connection of two wafers require using a total of four photomasks. Using so many photomasks can lead to high fabrication cost, too many process steps and a long fabrication time.

In view of this, the present invention provides a method of fabricating an IC device, which is capable of forming a contact opening and a contact hole for a contact in a self-aligned manner, thus ensuring good reliability of the resulting contact. Moreover, when used in a 3DIC process, the method is able to fabricate contacts and dummy contacts using less photomasks, lower cost and a simpler process.

Referring to FIG. 2, in an embodiment of the present invention, there is provided a method of fabricating an IC device, including the steps of:

S1) providing a first wafer containing a first conductive structure and forming a first dielectric layer on a surface of the first wafer;

S2) etching the first dielectric layer to form therein a first contact opening and first dummy openings, both the first contact and dummy openings not extending through the first dielectric layer, the first contact opening having a width that is greater than a width of the first dummy openings;

S3) forming a first sacrificial layer, which covers at least inner surfaces of the first dummy openings and a side surface of the first contact opening, with the first dielectric layer being exposed at a bottom surface of the first contact opening;

S4) under the protection of the first sacrificial layer, etching the first dielectric layer exposed in the first contact opening in a self-aligned manner until the first conductive structure under the first contact opening is exposed, thus forming a first self-aligned contact hole under the first contact opening; and S5) removing at least the first sacrificial layer in the first contact opening, the first self-aligned contact hole and the first dummy openings and filling the first contact opening, the first self-aligned contact hole and the first dummy openings with a metal, thereby forming a first contact and first dummy contacts.

Referring to FIG. 3(a), in step S1, the first wafer 30 to be bonded is provided. The first wafer 30 may be a wafer that has undergone the front-end-of-line (FEOL) phase or at least part of the back-end-of-line (BEOL) phase of IC manufacturing. It may include a substrate 300 and a passivation layer 301 covering the substrate 300. In the FEOL phase, various necessary components (e.g., active devices such as MOS devices, sensing devices, storage devices and diodes and/or passive devices such as capacitors, resistors and inductors) and isolation structures for isolating those components (shallow trench isolation or local oxidation isolation structures, not shown) may be formed in the substrate 300. Processing in the BEOL phase may include at least one of contact plug formation, copper interconnection, rewiring and the solder pad formation. In this phase, an interlayer dielectric layer (not shown) may be formed over the substrate 300, and conductive metal structures (e.g., conductive plugs or multi-layer metal interconnects) electrically connecting the components in the substrate 300 may be formed in the interlayer dielectric layer. Multiple interlayer dielectric layers may be formed, including at least one of silicon oxide, silicon nitride, silicon oxynitride, low-k dielectric (e.g., with a dielectric constant k lower than 2.5) and high-k dielectric (e.g., with a dielectric constant k higher than 7), for example. The first conductive structure 300a in the substrate 300 may be formed in the FEOL phase and/or BEOL phase and may be selected from, for example, at least one of a gate of a MOS device, a source/drain of a MOS device, a contact plug, a solder pad, a rewiring metal layer and a copper interconnect. It may be formed of a material including at least one of W, Co, Cu, Al, silicide, doped polysilicon, etc. The passivation layer 301 may serve both as a protective layer for the surface of the substrate 300 and as an etch stop layer during the subsequent etching process for forming the contact hole by etching the first dielectric layer. It may be formed of a material including at least one of silicon nitride, silicon oxide, silicon oxynitride, titanium nitride, tantalum nitride, etc.

With continued reference to FIG. 3 (a), in step S1, the first dielectric layer 31 covering the surface of the passivation layer 301 is then deposited using a suitable process such as chemical vapor deposition. The first dielectric layer 31 may be either a single dielectric film or a stack of multiple dielectric films. As an example, the first dielectric layer 31 includes, sequentially stacked over the first wafer 30, an interlayer dielectric layer 310 (e.g., a bonding oxide (BDOX) layer) and a hard mask layer 311. The interlayer dielectric layer 310 may be either a single film or a stack of multiple films (e.g., two, three or more films). It may be formed of a material including at least one of silicon oxide, silicon nitride, a low-k dielectric, nitrogen-doped silicon carbide, a bottom anti-reflective coating material, etc. The hard mask layer 311 may be either a single film or a stack of multiple films, and is preferably formed of a nitrogen-containing material. For example, it may consist of one, two, or three or more layers each made of at least one of silicon nitride (SiN), nitrogen-doped silicon carbide (NDC), titanium nitride (TiN) and tantalum nitride (TaN). It may be desired to exhibit a high etching selectivity ratio to the passivation layer 301 and the interlayer dielectric layer 310 and to be able to serve as a polish stop layer for a CMP process. It may be deposited to a thickness that is the sum of a thickness loss in the etching process for forming the first self-aligned contact hole, a thickness loss in the CMP process and a remaining thickness.

Referring to FIG. 3 (b), in step S2, a first photoresist layer (not shown) is applied to a top surface of the hard mask layer 311 by spin coating or a similar process, exposed with a first photomask having a pattern with features for the first contact (bonding pad) and the first dummy contact (bonding pad) and developed. As a result, through openings having different widths are formed in the patterned first photoresist layer. Subsequently, with the patterned first photoresist layer serving as a mask, the first contact opening 312a and the first dummy openings 312b are formed by etching through the hard mask layer 311 and etching away a partial thickness of the interlayer dielectric layer 310. That is, the first contact opening 312a and the first dummy openings 312b, both not extending through the first dielectric layer 31, are formed using a single photomask. The first contact opening 312a corresponds to the first contact, and the first dummy openings 312b correspond to the first dummy contacts. The first dummy openings 312b have a depth as specified and a width W2 that is less than a width W1 of the first contact opening 312a (e.g., $W2 \leq W1/2$). The first photoresist layer is then removed.

It is to be noted that, in order to avoid surface dishing that may occur due to a load effect of the subsequent CMP process for forming the first contact, the pattern of the first photomask may be so designed that the features for the first dummy contacts are scattered (evenly or not) around the feature for the first contact. As a result, two types of openings with different widths are formed in the first photoresist layer for the first contact and the first dummy contacts.

Referring to FIG. 3 (c), in step S3, the first sacrificial layer 313 is formed by deposition, spin coating or a similar process, which covers the top surface of the hard mask layer 311 and inner surfaces of the first contact opening 312a and the first dummy openings 312b. The first sacrificial layer 313 may be deposited to such a thickness that it fills up the first dummy openings 312b and covers both the side and bottom surfaces of the first contact opening 312a. However, as the first contact opening 312a is broader than the first dummy openings 312b, the first sacrificial layer 313 does not fill up the first contact opening 312a. The first sacrificial layer 313 is preferably selected as a carbon-based material that can be ashed away using a dry etching process. The material may include, for example, at least one of an organic polymer, photoresist, a bottom anti-reflective coating (BARC) material, spin-on carbon (SoC), amorphous carbon (α-C), etc.

It is to be noted that, in other embodiments of the present invention, since the width of the first contact opening 312a is greater than that of the first dummy openings 312b, the first sacrificial layer 313 formed in step S3 is thicker at the bottom surfaces of the first dummy openings 312b than at the bottom surface of the first contact opening 312a.

Referring to FIGS. 3 (d) and 3 (e), in step S4, an etching process is carried out to etch away the first sacrificial layer 313 on the top surface of the hard mask layer 311 and on the bottom surface of the first contact opening 312a, thus forming a sacrificial spacer 313a on the side surface of the first contact opening 312a. It should be noted that "a side surface" of the first contact opening here includes, but is not limited to, two side walls on the left and right sides as shown in FIGS. 3 (d) and 3 (e); "a sacrificial spacer" here includes, but is not limited to, two spacers formed on the two side walls of the first contact opening on the left and right sides respectively. The remainder of the first sacrificial layer 313b still fills up the first dummy openings 312b. After that, with the protection of the hard mask layer 311, the sacrificial spacer 313a and the first sacrificial layer 313b, an etching process is performed in the first contact opening 312a. The etching process proceeds through the interlayer dielectric layer 310 and the passivation layer 301 until a top surface of the first conductive structure 300a is partially exposed, resulting in the formation of the first self-aligned contact hole 312c. Under the protection of the sacrificial spacer 313a, a width W3 of the first self-aligned contact hole 312c is less than the width W1 of the first contact opening 312a.

Optionally, the sacrificial spacer 313a and the first sacrificial layer 313b in the first dummy openings 312b may be partially removed during the formation of the first self-aligned contact hole 312c by etching the interlayer dielectric layer 310 and the passivation layer 301 because this is favorable to the subsequent removal of the remaining sacrificial spacer 313a and first sacrificial layer 313b in the first dummy openings 312b. For example, top surfaces of the sacrificial spacer 313a and the first sacrificial layer 313b may be made flush with that of the interlayer dielectric layer 310.

It is to be noted that, concurrently with the formation of the first self-aligned contact hole 312c by etching the interlayer dielectric layer 310 and the passivation layer 301, the exposed hard mask layer 311 surrounding the first dummy openings 312b and the first contact opening 321a may also be partially but not wholly removed, and the remainder thereof may serve as a stop layer for the subsequent CMP process performed in step S5.

Referring to FIGS. 3 (e) and 3 (f), in step S5, the remainder of the first sacrificial layer (i.e., the sacrificial spacer 313a and the first sacrificial layer 313b) is removed using a dry ashing process so that the first contact opening 312a and first dummy openings 312b, as well as the top surface of the hard mask layer 311, are again exposed. A metal is then deposited on the top surface of the hard mask layer 311 using vapor deposition, sputtering or a similar process until it fills up the first contact opening 312a, the first self-aligned contact hole 312c and the first dummy openings 312b. Top surfaces of the deposited metal and the first dielectric layer 31 are planarized using a chemical mechanical polishing (CMP) process, resulting in the formation of the first contact 314a and the first dummy contacts 314b both with flat top surfaces. This CMP process may either stop at the top surface of the hard mask layer 311, or further proceed to remove the hard mask layer 311 and then stop at a desired remaining thickness of the interlayer dielectric layer 310. In this embodiment, the metal filled in the first contact opening 312a and the first self-aligned contact hole 312c in vertical communication with the first contact opening 312a makes up the first contact 314a, while the metal filled in the first dummy openings 312b forms the first dummy contacts 314b. Further, the top surfaces of the first contact 314a, the first dummy contacts 314b and the remaining first dielectric layer 31 constitute a flat surface.

It is to be noted that although the first self-aligned contact hole 312c in communication with the first contact opening 312a, in which the first contact 314a is formed, has been described as being formed by forming the sacrificial spacer 313a on the inner side surface of the first contact opening 312a through etching the first sacrificial layer and then deepening the first contact opening 312a under the protection of the sacrificial spacer 313a, the present invention is not so limited.

For example, in another embodiment of the present invention, the first sacrificial layer 313 formed in step S3 may fill up the first dummy openings 312b but not the first contact opening 312a. Rather, it may only cover the side and bottom surfaces of the first contact opening 312a. Moreover, the first dummy openings 312b may have a depth that is not less than a thickness of the first sacrificial layer 313 above the bottom surface of the first contact opening 312a. In this embodiment, the formation of the sacrificial spacer by etching the first sacrificial layer 313 is omitted in step S3. Instead, in step S4, the first sacrificial layer 313, the first dielectric layer 31 and the passivation layer 301 above the bottom surface of the first contact opening 312a are directly etched. As the first sacrificial layer 313 is thinner at the bottom surface of the first contact opening 312a than in the first dummy openings 312b, the first sacrificial layer 313 in the first contact opening 312a is removed first and the exposed interlayer dielectric layer 310 may be etched through in a short time, resulting in the formation of the first self-aligned contact hole 312c in which the first conductive structure 300a is exposed. When the etching stops at this time, the first sacrificial layer 313 in the first dummy openings 312b may lose only a partial thickness, resulting in the formation of etched back openings so that the underlying first dielectric layer 31 is not exposed in the etched back openings in the first dummy openings 312b. That is, only part of the first dummy openings 312a is exposed. Alternatively, the first sacrificial layer 313 in the first dummy openings 312b, optionally as well as a partial thickness of the interlayer dielectric layer 310 in the first dummy openings 312b, may be removed, resulting in further deepening of the first dummy openings 312b. However, the surface of the substrate 300 or that of the passivation layer 301 is not exposed in the deepened openings.

In the method of the present invention, the dielectric layer on the wafer is etched to simultaneously form the contact opening and dummy openings. Both do not extend through the dielectric layer, and the width of the contact opening is greater than that of the dummy openings. The sacrificial layer from which the dielectric layer on the bottom surface of the contact opening is exposed is then formed, and under the protection of this sacrificial layer, the dielectric layer exposed in the contact opening is etched in a self-aligned manner, resulting in the formation of the self-aligned contact hole, which is self-aligned with the contact opening, and in which the surface of the conductive structure in the wafer is exposed. In this way, reliability of the contact that extends in both the contact opening and the self-aligned contact hole is ensured without alignment errors therebetween, which may cause failure of the contact. Moreover, surface dishing that may be caused by a load effect of the CMP process is mitigated. Further, fabrication cost can be reduced because the formation of the contact hole, the contact opening and the dummy openings requires the use of only one photomask.

In a three-dimensional integrated circuit (3DIC) process for bonding two wafers together, the method of the present invention can be used to form, in bonding surface(s) of at least one of the wafers, contact holes for establishing electrical connection between the two wafers, contact openings in communication with the contact holes, and dummy openings which are scattered around the contact openings to mitigate surface dishing that may be caused by a load effect of a chemical mechanical polishing (CMP) process. The method of the present invention enables the bonding surfaces of the two wafers to have sufficiently high flatness without bonding bubbles, as required by the hybrid bonding process, avoids failure of the resulting contacts that may be caused by alignment errors between the contact holes and the respective contact openings, and reduces the number of used photomasks and hence fabrication cost. When used in such a three-dimensional integrated circuit (3DIC) process, the method of the present invention may particularly include the steps as detailed below.

At first, referring to FIGS. 2 and 3, steps S1-S5 as described above are performed to provide a first wafer 30 containing a first conductive structure 300a and provided on a surface thereof with a first dielectric layer 31 and to form a first contact 314a and first dummy contacts 314b in the first dielectric layer 31. The first contact 314a extends through the first dielectric layer 31 and is brought into electrical connection with the first conductive structure 300a. The first dummy contacts 314b are scattered around the first contact 314a and do not extend through the first dielectric layer 31.

Subsequently, referring to FIG. 4, step S6 (not shown) is performed to provide a second wafer 40 containing a second conductive structure 400a and provided on a surface of the second wafer 40 with a second dielectric layer 41 and to form a second contact 412a and second dummy contacts 412b in the second dielectric layer 41. The second contact 412a extends through the second dielectric layer 41 and is brought into electrical connection with the second conductive structure 400a. The second dummy contacts 412b are scattered around the second contact 412a and do not extend through the second dielectric layer 41.

Figure 4:
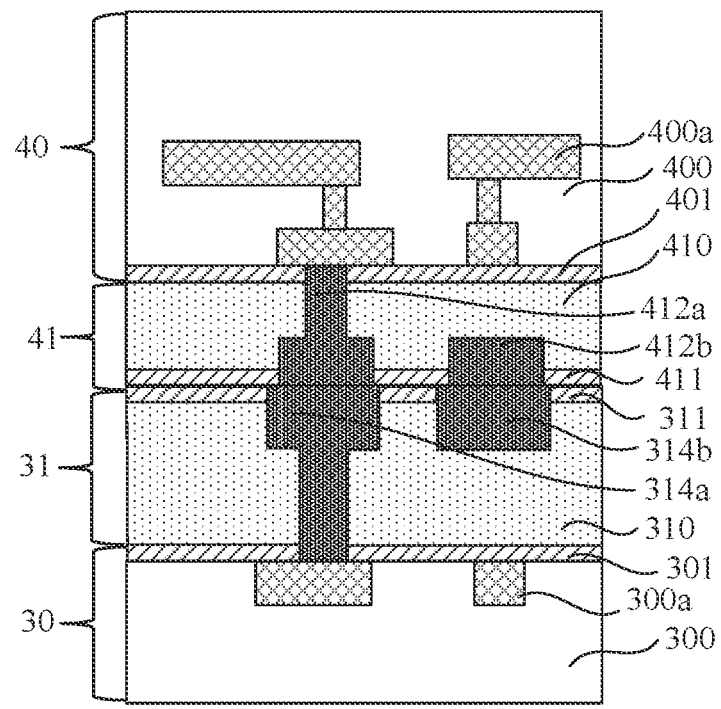
FIGS. 4 to 5 shows schematic cross-sectional views of structures resulting from steps in the method being used in a three-dimensional integrated circuit (3DIC) process according to a particular embodiment of the present invention.

Afterward, with continued reference to FIG. 4, step S7 (not shown) is performed, in which the first and second dielectric layer 31, 41 are held with their bonding surfaces facing each other and are then bonded together so that the first and second contacts 314a, 412a are aligned with each other.

Referring to FIG. 4, in step S6, the second wafer 40 containing the second conductive structure 400a and provided on its surface with the second dielectric layer 41. The second wafer 40 may include a substrate 400 containing the second conductive structure 400a and a passivation layer 401 covering top surfaces of the substrate 400 and the second conductive structure 400a. The second dielectric layer 41 may include an interlayer dielectric layer 410 on the surface of the passivation layer 401 and a hard mask layer 411 residing on the interlayer dielectric layer. The second contact 412a and the second dummy contacts 412b are formed in the second dielectric layer 41. The second contact 412a extends through both the hard mask layer 411 and the interlayer dielectric layer 410 and comes into electrical connection with the second conductive structure 400a. The second dummy contacts 412b extend through the hard mask layer 411 but not the interlayer dielectric layer 410. Top surfaces of the hard mask layer 411, the second contact 412a and the second dummy contact 412b, where the second wafer 40 is to be bonded in the hybrid bonding process, are flush with one another.

Optionally, in step S6, the second dielectric layer 41 on the surface of the second wafer 40 and the second contact 412a and the second dummy contacts 412b in the second dielectric layer 41 may be formed using conventional techniques. In this case, the formation of the contact hole and the contact opening for the second contact 412a and of the dummy openings for the second dummy contacts 412b may require the use of two photomasks. Therefore, according to this embodiment of the present invention, the formation of the first contact 314a, the first dummy contacts 314b, the second contact 412a and the second dummy contacts 412b requires the use of a total of three photomasks, resulting in the saving of one photomask compared to the prior art that would require the use of four photomasks for the same purpose. Therefore, a cost reduction and a process simplification can be achieved.

Preferably, as detailed below, in step S6, after the second dielectric layer 41 is formed on the surface of the second wafer 40, a second photomask (not shown) is used to form the second contact 412a and the second dummy contacts 412b in the second dielectric layer 41 in a similar manner as steps S1-S5 as taught herein.

At first, a second photoresist layer (not shown) is formed over the hard mask layer 411.

Subsequently, the second photoresist layer is exposed using the second photomask (not shown) that has a pattern with features for the second contact (not shown) and the second dummy contacts (not shown) and is then developed so that two types of openings with different widths are formed in the second photoresist layer.

Afterward, with the patterned (by the photolithography process) second photoresist layer serving as a mask, the hard mask layer 411 is etched through and a partial thickness of the interlayer dielectric layer 410 is etched way, resulting in the formation of a second contact opening (not shown) and second dummy openings (not shown). The second contact opening corresponds to the pattern feature for the second contact, while the second dummy openings correspond to the pattern features for the second dummy contacts. The second dummy openings have a depth as specified and a width that is less than a width of the second contact opening. The second photoresist layer is then removed.

A second sacrificial layer (not shown) is then deposited, which covers a top surface of the hard mask layer 411 and inner surfaces of the second contact opening and the second dummy openings. Although the second sacrificial layer fills up the second dummy openings and covers side and bottom surfaces of the second contact opening, it does not fill up the second contact opening.

Thereafter, an etching process is carried out to etch away the second sacrificial layer on the top surface of the hard mask layer 411 and on the bottom surface of the second contact opening. As a result, the remainder of the second sacrificial layer forms a sacrificial spacer on the side surface of the second contact opening and still fills up the second dummy openings.

Subsequently, under the protection of both the hard mask layer 411 and the remaining second sacrificial layer, an etching process is performed in the second contact opening. The etching process proceeds through the interlayer dielectric layer 410 and the passivation layer 401 until the second conductive structure 400a is exposed, resulting in the formation of a second self-aligned contact hole (not shown).

The remaining second sacrificial layer is then removed, and a metal is filled into the second self-aligned contact hole, the second contact opening and the second dummy openings by deposition, CMP or the like. The second dielectric layer 41 is then thinned, resulting in the formation of the second contact 412a and the second dummy contacts 412b. Top surface of the second dielectric layer 41, the second contact 412a and the second dummy contact 412b constitute the flat bonding surface of the second wafer 40 as required by the hybrid bonding process.

In this case, when the patterns of the first and second photomasks are different, the formation of the first contact 314a, the first dummy contacts 314b, the second contact 412a and the second dummy contacts 412b according to the present invention requires the use of two photomasks, resulting in the saving of two photomasks compared to the prior art that would require the use of four photomasks for the same purpose. Therefore, a cost reduction and a process simplification can be achieved. When the patterns of the first and second photomasks are identical and a single one of them can be reused, the formation of the first contact 314a, the first dummy contacts 314b, the second contact 412a and the second dummy contacts 412b according to the present invention requires the use of one photomask, resulting in the saving of three photomasks compared to the prior art. Therefore, an additional cost reduction and an additional process simplification can be achieved.

Referring to FIG. 4, in step S7 (not shown), the first wafer 30 and the second wafer 40 are bonded together in a hybrid bonding manner in which the first dielectric layer 31 is aligned with and bonded to the second dielectric layer 41 (i.e., the hard mask layers 311 and 411 are aligned with and bonded to each other) and the first contact 314a is aligned with and bonded to the second contact 412a.

The first dummy contacts 314b may also be aligned with and bonded to the second dummy contacts 412b or not. Alternatively, some of the first dummy contacts 314b may be bonded to some of the second dummy contacts 412b, while the others of the first dummy contacts 314b are offset from the others of the second dummy contacts 412b.

It is to be noted that the multiple first dummy contacts 314b scattered around the first contact 314a are formed to avoid surface dishing that may be caused by a load effect of the CMP process used during the formation of the first contact 314a, thereby ensuring sufficient flatness of the bonding surface of the first dielectric layer 31. The multiple second dummy contacts 412b scattered around the second contact 412a are formed to avoid surface dishing that may be caused by a load effect of the CMP process used during the formation of the second contact 412a, thus ensuring sufficient flatness of the bonding surface of the second dielectric layer 41. In this way, bubble defects will not occur between the bonding surfaces of the second dielectric layer 41 and the first dielectric layer 31 during the hybrid bonding process in step S7.

Figure 5:
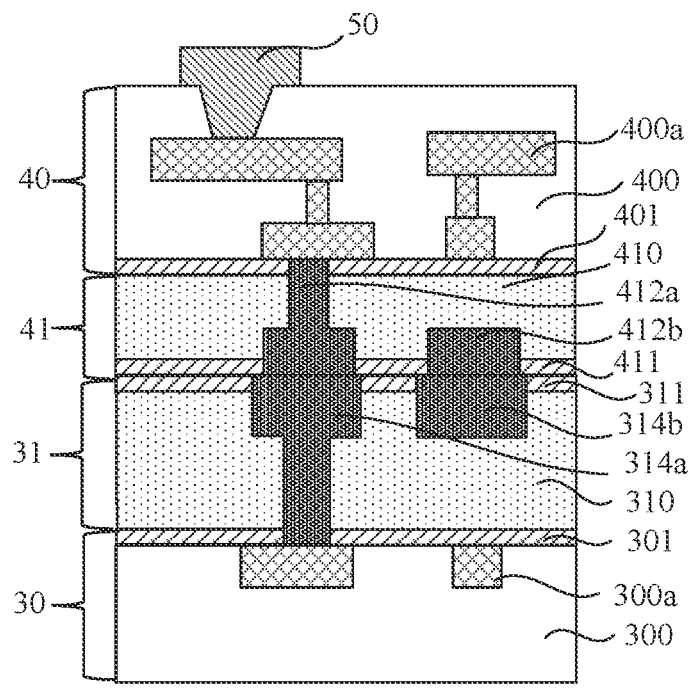

Optionally, referring to FIG. 5, subsequent to step S7, the method of the present invention may further include external electrical connection of the first conductive structure 300a and/or the second conductive structure 400a.

As an example, the external electrical connection of the second conductive structure 400a subsequent to step S7 may include:

first thinning the second wafer 40 from the side thereof facing away from the first wafer 30;

then performing a through silicon via (TSV) etching process on the side of the second wafer 40 facing away from the first wafer 30 and thereby forming a contact hole (not shown) in which a surface of the second conductive structure 400a facing away from the second dielectric layer 41 is partially exposed; and then forming a solder pad 50 in electrical contact with the second conductive structure 400a in the contact hole by processing including metal deposition and etching.

In summary, in the method of the present invention, the dielectric layer on the wafer is etched to simultaneously form the contact opening and dummy openings. Both do not extend through the dielectric layer, and the width of the contact opening is greater than that of the dummy openings. The sacrificial layer from which the dielectric layer on the bottom surface of the contact opening is exposed is then formed, and under the protection of this sacrificial layer, the dielectric layer exposed in the contact opening is etched in a self-aligned manner, resulting in the formation of the self-aligned contact hole, which is self-aligned with the contact opening, and in which the surface of the conductive structure in the wafer is exposed. In this way, reliability of the contact that extends in both the contact opening and the self-aligned contact hole is ensured without alignment errors therebetween, which may cause failure of the contact. Moreover, surface dishing that may be caused by a load effect of the CMP process is mitigated, ensuring the reliability of the subsequent processes. Further, fabrication cost can be reduced because fewer photomasks are used.

The foregoing description presents merely preferred embodiments of the present invention and is not intended to limit the scope of the present invention in any sense. It is intended that all changes and modifications made by those of ordinary skill in the art in light of the above teachings fall within the scope of the appended claims.

What is claimed is:

1. A method of fabricating an integrated circuit device, the method comprising:
providing a first wafer containing a first conductive structure and forming a first dielectric layer on a surface of the first wafer;
etching the first dielectric layer to form therein a first contact opening and a first dummy opening, both not extending through the first dielectric layer, the first contact opening having a width greater than a width of the first dummy opening;
forming a first sacrificial layer, which covers at least an inner surface of the first dummy opening and a side surface of the first contact opening, with the first dielectric layer being exposed at a bottom surface of the first contact opening;
under the protection of the first sacrificial layer, etching the first dielectric layer exposed in the first contact opening in a self-aligned manner until the first conductive structure under the first contact opening is exposed, thus forming a first self-aligned contact hole under the first contact opening; and
removing at least portion of the first sacrificial layer in the first contact opening, the first self-aligned contact hole and the first dummy opening and filling the first contact opening, the first self-aligned contact hole and the first dummy opening with a metal, thereby forming a first contact and a first dummy contact.

2. The method of claim 1, wherein the step of etching the first dielectric layer to form therein the first contact opening and the first dummy opening comprises:

applying a first photoresist layer onto a surface of the first dielectric layer and performing a photolithography process on the first photoresist layer using a first photomask having a pattern with features for the first contact and the first dummy contact, thereby forming, in the first photoresist layer, a first opening corresponding to the pattern feature for the first contact and a second opening corresponding to the pattern feature for the first dummy contact, the first opening having a width that is greater than a width of the second opening; and with the first photoresist layer that has undergone the photolithography process serving as a mask, etching the first dielectric layer to form therein the first contact opening and the first dummy opening.

3. The method of claim 1, wherein the step of forming the first sacrificial layer comprises:

forming the first sacrificial layer that covers surfaces of the first dielectric layer, the first contact opening and the first dummy opening and fills up the first dummy opening, the first dummy opening having a depth that is not less than a thickness of the first sacrificial layer covering the bottom surface of the first contact opening; and etching away an undesired portion of the first sacrificial layer so that the remainder of the first sacrificial layer fills up the first dummy opening and forms a sacrificial spacer over the side surface of the first contact opening, from which the first dielectric layer is exposed at the bottom surface of the first contact opening.

4. The method of claim 3, wherein in the step of etching the first dielectric layer exposed in the first contact opening in a self-aligned manner and thereby forming the first self-aligned contact hole, the sacrificial spacer over the side surface of the first contact opening and the first sacrificial layer filled in the first dummy opening are partially etched away so that a top surface of the sacrificial spacer is lowered and the first dummy opening is partially exposed.

5. The method of claim 3, wherein in the step of etching the first dielectric layer exposed in the first contact opening in a self-aligned manner and thereby forming the first self-aligned contact hole, the first self-aligned contact hole has a width less than the width of the first contact opening.

6. The method of claim 1, wherein the step of filling the first contact opening, the first self-aligned contact hole and the first dummy opening with the metal and thereby forming the first contact and the first dummy contact comprises:

depositing a metal until the metal covers a surface of the first dielectric layer and fills up the first contact opening, the first self-aligned contact hole and the first dummy opening; and performing a chemical mechanical polishing process on the metal and the first dielectric layer until the first dielectric layer is thinned to a specified thickness.

7. The method of claim 1, wherein the first sacrificial layer comprises a carbon-based material comprising at least one of an organic dielectric material, photoresist, a bottom anti-reflective coating material, a spin-on carbon and amorphous carbon.

8. The method of claim 7, wherein the remainder of the first sacrificial layer is ashed away after the first self-aligned contact hole is formed.

9. The method of claim 1, further comprising:

providing a second wafer containing a second conductive structure and provided with a second dielectric layer on a surface of the second wafer and forming a second contact and a second dummy contact in the second dielectric layer, the second contact extending through the second dielectric layer and coming into electrical connection with the second conductive structure, the second dummy contact not extending through the second dielectric layer; and performing a hybrid bonding process in which the first and second dielectric layers are oriented to face each other and the first and second contacts are aligned with and bonded to each other.

10. The method of claim 9, wherein the step of forming the second contact and the second dummy contact in the second dielectric layer comprises:

etching the second dielectric layer to form therein a second contact opening and a second dummy opening, both not extending through the second dielectric layer, the second contact opening having a width that is greater than a width of the second dummy opening;

forming a second sacrificial layer, which covers at least an inner surface of the second dummy opening and a side surface of the second contact opening, with the second dielectric layer being exposed at a bottom surface of the second contact opening;

under the protection of the second sacrificial layer, etching the second dielectric layer exposed in the second contact opening in a self-aligned manner until the second conductive structure under the second contact opening is exposed, thus forming a second self-aligned contact hole; and removing at least portion of the second sacrificial layer in the second contact opening, the second self-aligned contact hole and the second dummy opening and filling the second contact opening, the second self-aligned contact hole and the second dummy opening with a metal, thereby forming a second contact and a second dummy contact.

11. The method of claim 9, wherein the first conductive structure comprises at least one of a gate, a source/drain, a contact plug, a solder pad, a rewiring metal layer and a copper interconnect, and wherein the second conductive structure comprises at least one of a gate, a source/drain, a contact plug, a solder pad, a rewiring metal layer and a copper interconnect.

12. The method of claim 9, wherein as a result of the hybrid bonding process, the first dummy contact is aligned with and bonded to the second dummy contact.

13. The method of claim 9, wherein the first dummy contact is not aligned with and bonded to the second dummy contact.

14. The method of claim 9, further comprising, subsequent to the hybrid bonding of the first and second wafers, external electrical connection of the second conductive structure and/or the first conductive structure.

15. The method of claim 9, wherein the formation of the second contact and the second dummy contact requires the use of a second photomask.

16. The method of claim 9, wherein a plurality of first dummy contacts scattered around the first contact are formed to ensure sufficient flatness of a bonding surface of the first dielectric layer, a plurality of second dummy contacts scattered around the second contact are formed to ensure sufficient flatness of a bonding surface of the second dielectric layer.

17. The method of claim 1, wherein the first dielectric layer comprises, sequentially stacked over the first wafer, an interlayer dielectric layer and a hard mask layer, the interlayer dielectric layer formed as a single film or a stack of multiple films, the hard mask layer formed as a single film or a stack of multiple films.

18. The method of claim 17, wherein the interlayer dielectric layer is formed of a material including at least one of silicon oxide, silicon nitride, a low-k dielectric, nitrogen-doped silicon carbide, a bottom anti-reflective coating material, and the hard mask layer is formed of a nitrogen-containing material.

* * * * *